United States Patent
Bhopte et al.

(10) Patent No.: US 10,133,321 B1
(45) Date of Patent: Nov. 20, 2018

(54) ISOLATED ACTIVE COOLING SYSTEM FOR NOISE MANAGEMENT

(71) Applicant: Microsoft Technology Licensing, LLC, Redmond, WA (US)

(72) Inventors: Siddharth Bhopte, Redmond, WA (US); Bo Dan, Redmond, WA (US); Cindy Martinez, Sammamish, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 15/639,491

(22) Filed: Jun. 30, 2017

(51) Int. Cl.
*A61F 11/06* (2006.01)
*G06F 1/20* (2006.01)
*H05K 7/20* (2006.01)
*G10K 11/178* (2006.01)

(52) U.S. Cl.
CPC .............. *G06F 1/20* (2013.01); *G10K 11/178* (2013.01); *H05K 7/20145* (2013.01); *G10K 2210/11* (2013.01); *G10K 2210/3028* (2013.01)

(58) Field of Classification Search
CPC ....................................................... A61F 11/06
See application file for complete search history.

(56) References Cited

U.S. PATENT DOCUMENTS

| | | | |
|---|---|---|---|
| 4,461,796 A * | 7/1984 | Fukahori | B29D 24/005 428/116 |
| 6,257,832 B1 | 7/2001 | Lyszkowski et al. | |
| 6,330,336 B1 * | 12/2001 | Kasama | G10K 11/178 381/71.1 |
| 6,470,289 B1 | 10/2002 | Peters et al. | |
| 6,873,883 B2 | 3/2005 | Ziarnik | |
| 7,693,292 B1 * | 4/2010 | Gross | G10K 11/1782 381/71.12 |

(Continued)

FOREIGN PATENT DOCUMENTS

| | | |
|---|---|---|
| WO | 2012113729 A1 | 8/2012 |
| WO | 2012166388 A2 | 12/2012 |
| WO | 2013029432 A1 | 3/2013 |

OTHER PUBLICATIONS

Sharma, et al., "CPU Fan Noise Control by Active Noise Cancellation", In International Research Journal of Engineering and Technology, vol. 3, Issue 2, Feb. 2016, pp. 518-521.

(Continued)

*Primary Examiner* — Olisa Anwah
(74) *Attorney, Agent, or Firm* — Arent Fox LLP

(57) ABSTRACT

A computer device may include one or more electronic components located in a passive cooling zone. A wall divides the passive cooling zone from an active cooling zone and acoustically isolating the active cooling zone from the passive cooling zone. A heat sink attached to at least one of the one or more electronic may extend from the passive cooling zone to the active cooling zone through the wall. At least one noise emitting component may be located in the active zone. A method of controlling noise in the computer device may include determining, by a processor of the computer device located in the passive cooling zone, a noise frequency of a noise emitting component located within an active cooling zone of the computer device. The processor may control a speaker within the active cooling zone to emit anti-noise cancelling the noise frequency.

15 Claims, 6 Drawing Sheets

(56) References Cited

U.S. PATENT DOCUMENTS

| | | | |
|---|---|---|---|
| 8,320,121 B2 | 11/2012 | Bisson et al. | |
| 8,392,035 B2* | 3/2013 | Patel | G06F 1/20 361/688 |
| 8,955,337 B2 | 2/2015 | Parish et al. | |
| 9,311,909 B2 | 4/2016 | Giaim et al. | |
| 2001/0014163 A1* | 8/2001 | Hickman | G10K 11/161 381/71.5 |
| 2002/0172005 A1* | 11/2002 | Ford | G06F 1/203 361/679.53 |
| 2004/0004817 A1 | 1/2004 | Greco | |
| 2005/0094823 A1 | 5/2005 | Kobori et al. | |
| 2005/0174737 A1 | 8/2005 | Meir | |
| 2005/0288886 A1* | 12/2005 | Therien | G06F 1/206 702/130 |
| 2009/0092262 A1 | 4/2009 | Costa et al. | |
| 2010/0002385 A1 | 1/2010 | Lyon et al. | |
| 2010/0002890 A1* | 1/2010 | Lyon | G10K 11/178 381/71.5 |
| 2010/0030395 A1 | 2/2010 | Shimotono et al. | |
| 2012/0205079 A1 | 8/2012 | Jewell-larsen et al. | |
| 2012/0308024 A1 | 12/2012 | Alderson et al. | |
| 2014/0226282 A1* | 8/2014 | Tang | H05K 7/20172 361/694 |
| 2014/0263936 A1* | 9/2014 | Desantis | G06F 1/203 248/676 |
| 2015/0030437 A1* | 1/2015 | Chen | F04D 29/4226 415/122.1 |
| 2015/0110283 A1* | 4/2015 | Cheng | G06F 1/20 381/71.1 |
| 2015/0293567 A1* | 10/2015 | Broadwell | G06F 1/203 361/679.48 |
| 2015/0337857 A1* | 11/2015 | Lu | F04D 29/522 417/423.14 |
| 2016/0363968 A1* | 12/2016 | Schubert | G06F 1/20 |
| 2017/0242463 A1* | 8/2017 | Matteson | G06F 1/206 |

OTHER PUBLICATIONS

"International Search Report & Written Opinion Issued in PCT Application No. PCT/US2018/034520", dated Sep. 3, 2018, 14 Pages.

* cited by examiner

ISOLATED ACTIVE COOLING SYSTEM FOR NOISE MANAGEMENT

BACKGROUND

The present disclosure relates to cooling systems, and more particularly, to cooling systems for electronic devices.

Cooling systems for electronic devices such as computers often include a fan that moves air over various components to remove heat generated by the components. Such cooling systems are typically associated with the noise created by the fan, which a user of the device can consider unpleasant or distracting. Additionally, as part of having the fan move the warm air, it is likely that the air warmed by one component may be passed over another component that does not generate heat. The warmed air may actually result in heating the other component. Accordingly, to address some of these issues, there is a need for improved mechanisms for controlling heat and noise generated by a computing device.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its purpose is to present some concepts of one or more implementations in a simplified form as a prelude to the more detailed description that is presented later.

A cooling system having isolated active and passive cooling zones is described. Generally, the active and passive cooling zones are separated by a wall that acoustically isolates the active zone from the passive cooling zone.

In one example, a computer device includes one or more electronic components located in a passive cooling zone. The computer device includes a wall dividing the passive cooling zone from an active cooling zone and acoustically isolating the active cooling zone from the passive cooling zone. The computer device includes a heat sink attached to at least one of the one or more electronic components. The heat sink may extend from the passive cooling zone to the active cooling zone through the wall. The computer device may include a noise emitting component located in the active cooling zone.

In another example implementation, a method of controlling noise in a computer device includes determining, by a processor of the computer device, a noise frequency of a noise emitting component located within an active cooling zone of the computer device that is acoustically isolated from a passive cooling zone of the computer device containing at least the processor. The method may include controlling a speaker within the active cooling zone to emit anti-noise cancelling the noise frequency.

In yet another example implementation, a non-transitory computer-readable medium may include code executable by one or more processors for controlling noise in a computer device. The non-transitory computer-readable medium may include code for determining, by a processor of the computer device, a noise frequency of a noise emitting component located within an active cooling zone of the computer device, the active cooling zone being acoustically isolated from a passive cooling zone of the computer device containing at least the processor. The non-transitory computer-readable medium may include code for controlling a speaker within the active cooling zone to emit an anti-noise signal cancelling the noise frequency.

Additional advantages and novel features relating to implementations of the present disclosure will be set forth in part in the description that follows, and in part will become more apparent to those skilled in the art upon examination of the following or upon learning by practice thereof.

BRIEF DESCRIPTION OF THE DRAWINGS

The specific features, implementations, and advantages of the disclosure will become better understood with regard to the following description, appended claims, and accompanying drawings where:

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts. In some implementations, examples may be depicted with reference to one or more components and one or more methods that may perform the actions or operations described herein, where components and/or actions/operations in dashed line may be optional.

The present disclosure relates to a cooling system having isolated active and passive cooling zones. Generally, the active and passive cooling zones are separated by a wall that acoustically isolates the active zone from the passive cooling zone. In at least some implementations, the separation of the active cooling zone from the passive cooling zone allows for planning of noise reduction for the active cooling zone. For example, the active cooling zone may be designed to reduce impedance to airflow. The noise of the active cooling zone may be reduced because the lower impedance allows a lower fan speed to provide the same amount of airflow. According to various implementations, predictable noise properties of the active cooling zone may be used to reduce or cancel the noise. For example, filters may be added to the active cooling zone to filter out undesired noise frequencies. As another example, anti-noise may be generated to cancel out predicted or detected noise in the active cooling zone.

Figure 1:
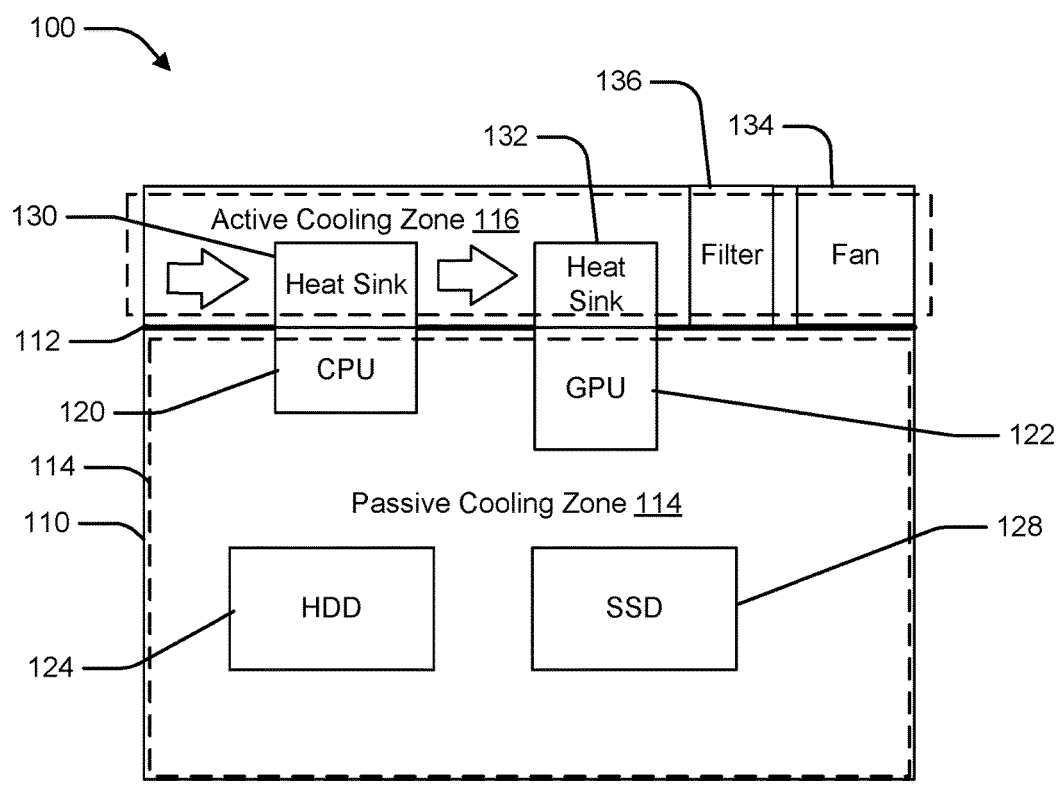
FIG. 1 is a block diagram of a cooling system for a computer device, according to an implementation.

FIG. 1 is a block diagram of an example computer device 100, including a wall 112 separating a passive cooling zone 114 from an active cooling zone 116. The computer device 100 may be contained within a case 110. The case 110 may be any shape defining an enclosed space housing components of the computer device 100. For example, the case 110 may be a server rack, personal computer case, laptop housing, tablet housing, or phone housing.

The wall 112 may be any division that acoustically and/or aerodynamically isolates the active cooling zone 116 from the passive cooling zone 114. For example, the wall 112 may include a sheet that generally prevents air flow between the passive cooling zone 114 and the active cooling zone 116. The wall 112 may be formed of a thermally conductive material (e.g., copper, aluminum) to allow passive cooling through the wall 112. The wall 112 may also include openings that allow a passive cooling component (e.g., a heat sink) to pass from the passive cooling zone 114 to the active cooling zone 116.

The passive cooling zone 114 may include electronic components that generally do not generate significant noise. For example, the sound energy generated by the electronic components in the passive cooling zone 114 may be less than a threshold (e.g., 20 dB). The electronic components in the passive cooling zone 114 may include components that generate heat. For example, a central processing unit (CPU) 120 and graphics processing unit (GPU) 122 may generate relatively large amounts of heat. As illustrated the CPU 120 and the GPU 122 may be coupled with heat sinks 130 and 132, respectively. The heat sinks 130, 132 may be examples of passive cooling components. For example, the heat sinks 130, 132 may be formed of a thermally conductive material that contacts a heat emitting component. A thermally conductive paste may improve thermal coupling between a heat emitting component and the heat sink 130, 132. The heat sinks 130, 132 may pass through the wall 112 from the passive cooling zone 114 to the active cooling zone 116. In the active cooling zone, the heat sinks 130, 132 may include a plurality of fins or other thin structures for dissipating heat. A hard disk drive (HDD) 124 and solid state drive (SSD) 126 may be electronic components that generate relatively less heat than the CPU 120 and GPU 122. The HDD 124 and the SSD 126 may not be associated with a specific passive cooling component, but may be passively cooled by thermally conductive elements forming the passive cooling zone 114 (e.g., the case 110).

Figure 6:
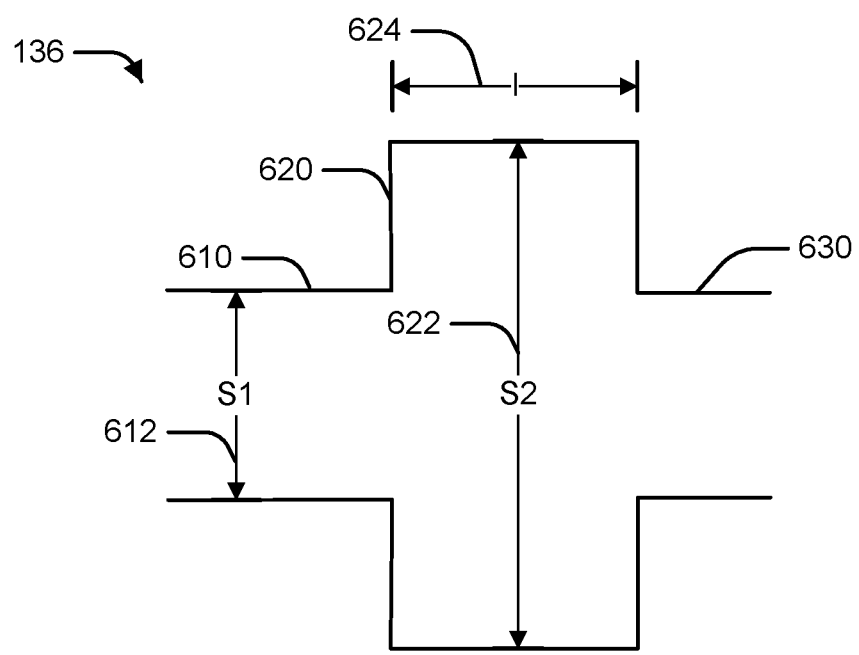
FIG. 6 is a schematic diagram of an example noise filter.

The active cooling zone 116 defines an area of the case 110 that is generally cooled by moving air through the active cooling zone 116. The active cooling zone 116 may include noise emitting components that generate relatively high levels of noise. For example, the active cooling zone 116 may include one or more fans, capacitors, inductors, transformers, or power supplies. In some implementations, the HDD 124 may be considered a noise emitting component and may be placed in the active cooling zone 116. The active cooling zone 116 may also include noise mitigating components. For example, as illustrated, the active cooling zone 116 can include a noise filter 136. The noise filter 136 may be a structure designed to filter out noise at a predicted frequency while still allowing airflow through the active cooling zone 116. The noise filter 136 may include one or more static shapes for filtering a noise frequency emitted by a noise emitting component. For example, the noise filter 136 may include air channels defined by volumes and ports shaped to filter out specific audible frequencies generated by a noise emitting component. A volume may include a relatively open space into which air may flow. A port may be a relatively narrow opening between two volumes. An example noise filter 136 is illustrated in FIG. 6. The noise filter 136 may include a channel 610 having a first cross-sectional area (S1) 612. The channel 610 may connect to a volume 620 having a second cross-sectional area (S2) 622 and a length (l) 624. The volume 620 may connect to a second channel 630, which may have the first-cross-sectional area (S1) 612. The example noise filter 136 may be used a low pass filter that blocks higher frequency sounds. For example, the noise filter 136 may have a cut off frequency ($f_c$) according to equation 1:

$$f_c = \frac{cs_1}{\pi l(s_2 - s_1)} \qquad (1)$$

The term c in the equation 1 is speed of sound. Additionally, the noise filter 136 may include a mesh that reduces air speed through a channel. The static shapes may reduce the noise by absorbing or redirecting the acoustic waves of the specific audible frequencies. Another example of a noise management component is a speaker that generates anti-noise to cancel an observed or predicted noise signal, as described in further detail below.

The components within the active cooling zone 116 may be arranged in a manner that reduces impedance to airflow. For example, by isolating the active cooling zone 116 from the components in the passive cooling zone 114, the components in the passive cooling zone 114 do not impede the flow of air in the active cooling zone 116. As another example, the heat sinks 130 and 132 can each include a plurality of fins that dissipate heat into the surrounding air. In an implementation, the fins of the heat sinks 130, 132 are aligned with a direction of airflow through the active cooling zone 116 such that the air flows between the fins. By reducing the impedance to airflow, the active cooling zone 116, the fan 134 may provide the same amount of airflow while operating at a lower speed. Since fan noise is a major source of noise in a computer device, the reduction of fan speed may reduce overall noise without reducing cooling performance.

Figure 2:
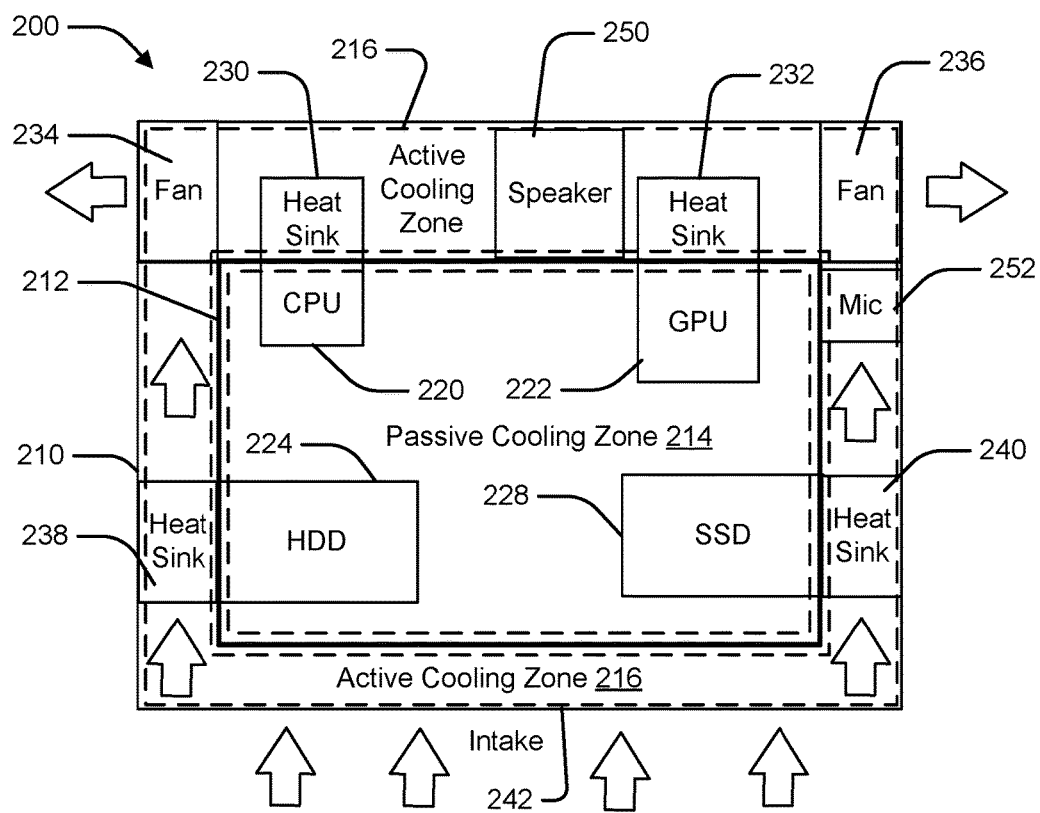
FIG. 2 is a block diagram of another cooling system for a computer device, according to another implementation.

FIG. 2 is a block diagram of another example computer device 200. The computer device 200 includes a case 210 that is divided into a passive cooling zone 214 and an active cooling zone 216 by a wall 212. The passive cooling zone 214 may be similar to the passive cooling zone 114 and include a CPU 220, GPU 222, HDD 224, and SSD 228, for example. Likewise, the active cooling zone 216 may be similar to the active cooling zone 116 and include similar but more numerous components. The wall 212 may extend in more than one direction. For example, as illustrated, the wall 212 defines an enclosed interior passive cooling zone 214 that is surrounded by an active cooling zone 216. In this arrangement, the wall 212 may provide a relatively greater area for interfacing between the passive cooling zone 214 and the active cooling zone 216. For example, a HDD 224 may be coupled with a heat sink 238 passing through the wall 212 and the SSD may be associated with a heatsink 240 passing through the wall 212. The case 210 may also include an intake region 242 and fans 234, 236.

The active cooling zone 216 may include a speaker 250 for generating an anti-noise signal to cancel one or more system noise signals generated by other components of the active cooling zone 216. For example, the anti-noise signal may be a sound wave with the same frequency and amplitude but with inverted phase (also known as antiphase) to the system noise signal. The active cooling zone 216 may include a microphone 252 for detecting noise within the active cooling zone 216. The speaker 250 may generate the anti-noise based on a signal generated by the microphone 252. For example, the computer device 200 may invert the phase of the signal detected by the microphone 252 and provide the inverted signal to the speaker 250. In another implementation, the anti-noise may be based on an rotational speed (e.g., revolutions per second (RPS)) of one or more fans 234, 236. For example, the CPU 220 may correlate fan speed with a previously detected system noise signal. The CPU 220 may then generate the anti-noise signal based on characteristics of the previously detected system noise (e.g., noise spectrum).

The fans 134, 234, 236 may produce a blade pass frequency tone. For example, a fan running at a constant speed may cause the surrounding air to resonate at a frequency based on the number of blades and the rotational speed of the fan (i.e., the number of times a blade passes a stator). The blade pass frequency tone may be observed by a user. The computer device 200 may mitigate a blade pass frequency tone based on known characteristics of the blade pass frequency. For example a digital signal processing notch filter may be used to isolate the blade pass frequency tone in either the microphone signal or the anti-noise signal to improve noise cancellation of the blade pass frequency tone. For example, a notch filter for a known problematic frequency may be used to cause attenuation at the problematic frequency. In another implementation, the computer device 200 may continuously vary the fan speed to mitigate a blade pass frequency tone. For example, if the blade pass frequency tone is at a frequency easily perceptible to human hearing (e.g., 1 kHz), the fan speed may be varied to avoid a constant tone at that frequency. The fan speed may have an average speed equal to a desired speed for cooling the active cooling zone 216.

Figure 3:
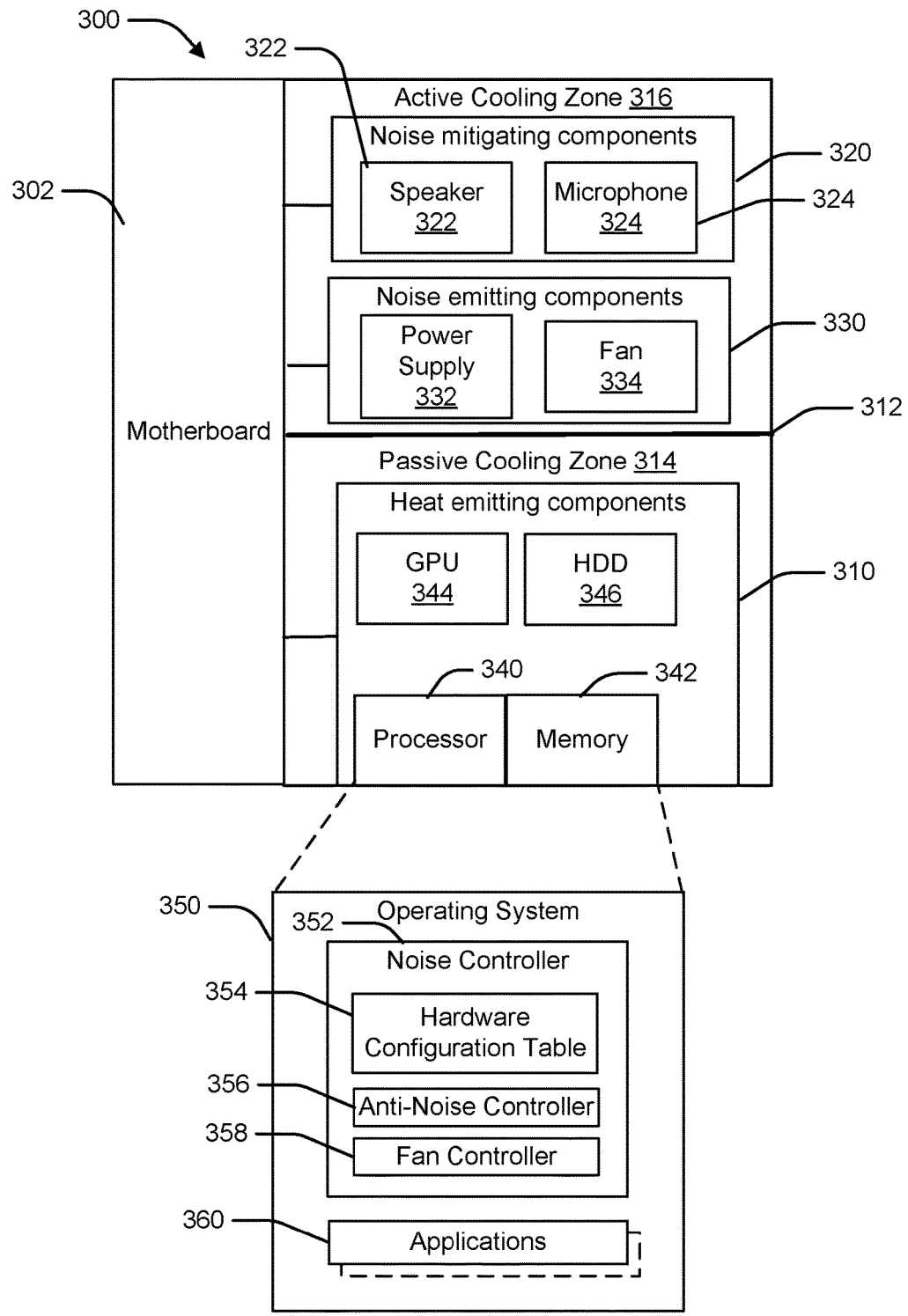
FIG. 3 is a schematic diagram of a computer device including a noise management component.

Referring now to FIG. 3, a computer device 300 may include a noise controller 352 for controlling noise produced by noise emitting components 330 in an active cooling zone 316. The computer device 300 may include a motherboard 302 for coupling various electronic components. A wall 312 may divide the active cooling zone 316 from the passive cooling zone 314. Passive cooling components such as heat sinks and connectors such as cables and wires may pass through the wall 312, but the wall 312 may generally prevent airflow between the active cooling zone 316 and the passive cooling zone 314. The wall 312 need not be air-tight as leakage may not be a major source of noise.

The computer device 300 may include a memory 342 and processor 340 configured to control the operation of computer device 300. Memory 342 may be configured for storing data and/or computer-executable instructions defining and/or associated with an operating system 350 and/or application 360, and processor 340 may execute operating system 350 and/or application 360. An example of memory 342 can include, but is not limited to, a type of memory on a chip, such as random access memory (RAM), read only memory (ROM), volatile memory, non-volatile memory, and any combination thereof. Memory 342 may store local versions of applications being executed by processor 340.

The computer device 300 may include one or more processors 340 for executing instructions. An example processor 340 can include, but is not limited to, any processor specially programmed as described herein, including a controller, microcontroller, application specific integrated circuit (ASIC), field programmable gate array (FPGA), or other programmable logic or state machine. The processor 340 may include other processing components such as an arithmetic logic unit (ALU), registers, and a control unit.

The processor 340 and the memory 342 may be considered heat emitting components 310. Other heat emitting components 310 may include GPU 344, and HDD 346. The heat emitting components 310 may be arranged in the passive cooling zone 314 as described above with respect to FIG. 1 and FIG. 2 to provide passive cooling to each heat emitting component 310.

The operating system 350 may include instructions (such as noise controller 352 and one or more applications 360) stored in memory 342 and executable by the processor 340. The operating system 350 may include noise controller 352 for managing the one or more noise emitting components 330 or noise mitigating components 320 in the active cooling zone 316, in particular. For example, the noise controller 352 may control a noise emitting component 330 by setting an operating parameter for the noise emitting component 330. For example, an operating parameter of a fan 334 may be a fan speed, or a voltage that controls fan speed.

A hardware configuration table 354 may provide information regarding features of the noise emitting components 330 and/or the noise mitigating components 320. In an implementation, each hardware component connected to the motherboard 302 may provide information to be stored in the hardware configuration table. The information may be initially stored in a memory of the hardware component (e.g., a read-only memory) and provided to the operating system 350 during installation or boot-up. The hardware configuration table 354 may store, for example, available operating parameters of the components. The hardware configuration table 354 may also store information regarding known noise frequencies produced by the hardware component. For example, the hardware configuration table 354 may store a profile indicating noise frequencies generate at one or more operating parameters.

The noise controller 352 may include an anti-noise controller 356 for controlling one or more noise mitigating components 320 to reduce noise emitted by the noise emitting components 330. For example, the noise controller 352 may control the speaker 322 to emit anti-noise based on an input signal from the microphone 324. In another implementation, the noise controller 352 may control the speaker 322 to emit anti-noise based on a stored anti-noise signal associated with a noise frequency of a noise emitting component 330. For example, when the power supply 332 operates at a certain power level (e.g., 100 watts), the anti-noise controller 356 may generate anti-noise based on previously detected noise when the power supply 332 was operating at the certain power level.

The noise controller 352 may include a fan controller 358 for controlling a fan speed. The fan speed may generally be based on a desired level of cooling needed. For example, the fan controller 358 may determine a fan speed as a function of a temperature of a component such as the processor 340. As discussed above, a fan 334 may produce a noise based on a blade pass frequency. In particular, when the fan speed is set at a certain rotational speed (e.g., revolutions per second), a blade of the fan may pass a stator at a multiple of the rotational speed depending on the number of blades of the fan. In some cases, the passing blades may cause a resonant tone at the blade pass frequency that can be heard by users of the computer device 300. The fan controller 358 may reduce the effects of a blade pass frequency tone by continuously varying the rotational speed of the fan 334. In an implementation, the fan controller 358 may vary the rotational speed in a range surrounding the desired rotational speed. For example, the fan controller 358 may vary the rotational speed by 5-10 percent above and/or below the desired rotational speed. The fan controller 358 may vary the speed such that the average rotational speed over a window of time meets the desired rotational speed. Accordingly, the average airflow and cooling effect may remain at the desired level.

The applications 360 may include one or more applications executable by the processor 340. The applications 360 may include operating system processes as well as user installed programs. The applications 360 may be referred to as programs. The applications 360 may utilize system resources such as processor cycles. Generally, with more intense resource use, the applications may cause the heat emitting components 310 to emit more heat. By cooling the heat emitting components 310 while also controlling noise emitted by noise emitting components 330, the noise controller 352 may improve performance of applications 360 and improve user experience.

Figure 4:
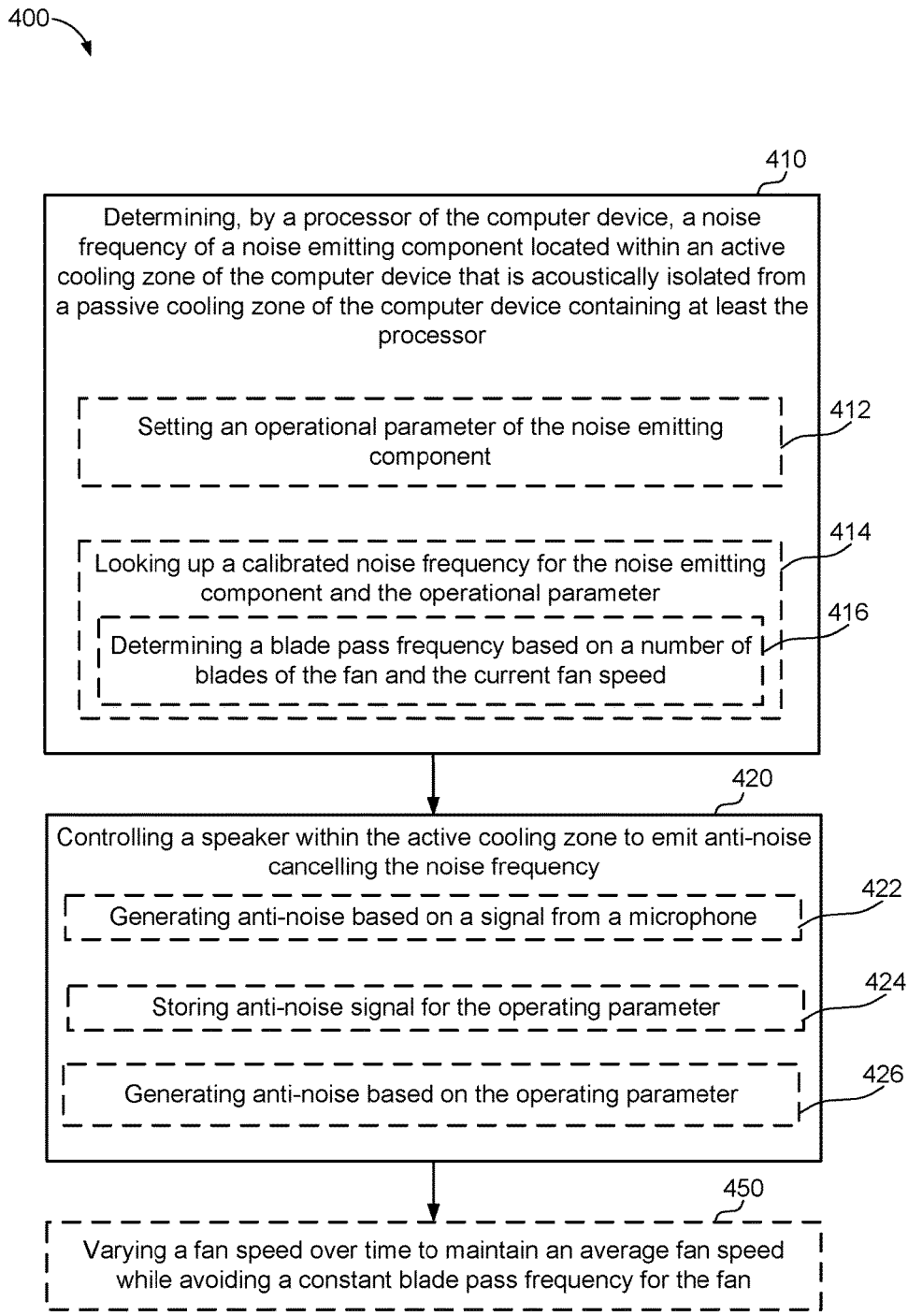
FIG. 4 is a flowchart of a method of controlling noise in a computer device.

Referring now to FIG. 4, an example method 400 provides for the computer device 300 to control noise levels. For example, method 400 may be used by the noise controller 352, as executed on computer device 300. It should be appreciated that the example computer devices 100, 200 may similarly include a noise controller 352 and perform the method 400.

At 410, the method 400 may include determining, by a processor of the computer device, a noise frequency of a noise emitting component located within an active cooling zone of the computer device that is acoustically isolated from a passive cooling zone of the computer device containing at least the processor. In an implementation, for example, the processor 340 may execute the noise controller 352 to determine a noise frequency of a noise emitting component 330 based on the hardware configuration table 354. The noise emitting component 330 may be located within an active cooling zone 316 of the computer device 300 that is acoustically isolated from a passive cooling zone 314 of the computer device containing at least the processor 140.

At 412, the action 410 may include setting an operational parameter of the noise emitting component. For example, the operating system 350 may set an operational parameter of a noise emitting component 330 based on system demands (e.g., required power or current temperature). In an implementation, the fan controller 358 may set a fan speed based on a current temperature. The noise controller 352 may then determine the noise frequency based on and in response to setting the operational parameter of the noise emitting controller. For example, at 414, the action 410 may include looking up a calibrated noise frequency for the noise emitting component and the operational parameter. In an implementation, the noise controller 352 may look up the calibrated noise frequency for the noise emitting component 330 in the hardware configuration table 354. As another example, at 416, the action 414 may include determining a blade pass frequency based on a number of blades of the fan and the current fan speed. The noise controller 352 may look up the number of blades of the fan 334 and calculate the blade pass frequency, which may be considered a calibrated noise frequency.

At 420, the method 400 may include controlling a speaker within the active cooling zone to emit anti-noise cancelling the noise frequency. In an implementation, for example, the anti-noise controller 356 may control a speaker 322 within the active cooling zone 316 to emit anti-noise cancelling the noise frequency. At 422, the action 420 may optionally include generating anti-noise based on a signal from a microphone. For instance, the anti-noise controller 356 may generate the anti-noise based on a signal from the microphone 324. For example, the anti-noise controller 356 may receive a signal produced by the microphone 324 and output an anti-noise signal with an inverted phase. The speaker 322 may convert the anti-noise signal into anti-noise acoustic waves that cancel the noise detected by the microphone.

At 424 the action 420 may optionally include storing the anti-noise signal for the operating parameter. In an implementation, for example, the anti-noise controller 356 may store the anti-noise signal for the operating parameter (e.g., in memory 342). At 426, the action 420 may optionally include generating anti-noise based on the operating parameter. In an implementation, for example, the anti-noise controller 356 may generate the anti-noise based on the operating parameter. For instance, the anti-noise controller 356 may look up a stored anti-noise signal based on the operating parameter and control the speaker 322 to convert the anti-noise signal into anti-noise acoustic waves to cancel the noise generated by a noise emitting component 330 at the operating parameter. By predicting the noise based on the operating parameter, the anti-noise controller may more effectively cancel the noise by time-aligning the anti-noise with the noise as the noise is emitted.

At 450, the method 400 may optionally include varying a fan speed over time to maintain an average fan speed while avoiding a constant blade pass frequency for the fan. In an implementation, for example, the fan controller 358 may vary a fan speed over time to maintain an average fan speed while avoiding a constant blade pass frequency for the fan 334. For instance, the fan controller 358 may vary the fan speed when a fan speed associated with resonant blade pass frequencies observable by a human is selected based on a current temperature of the processor 340.

Figure 5:
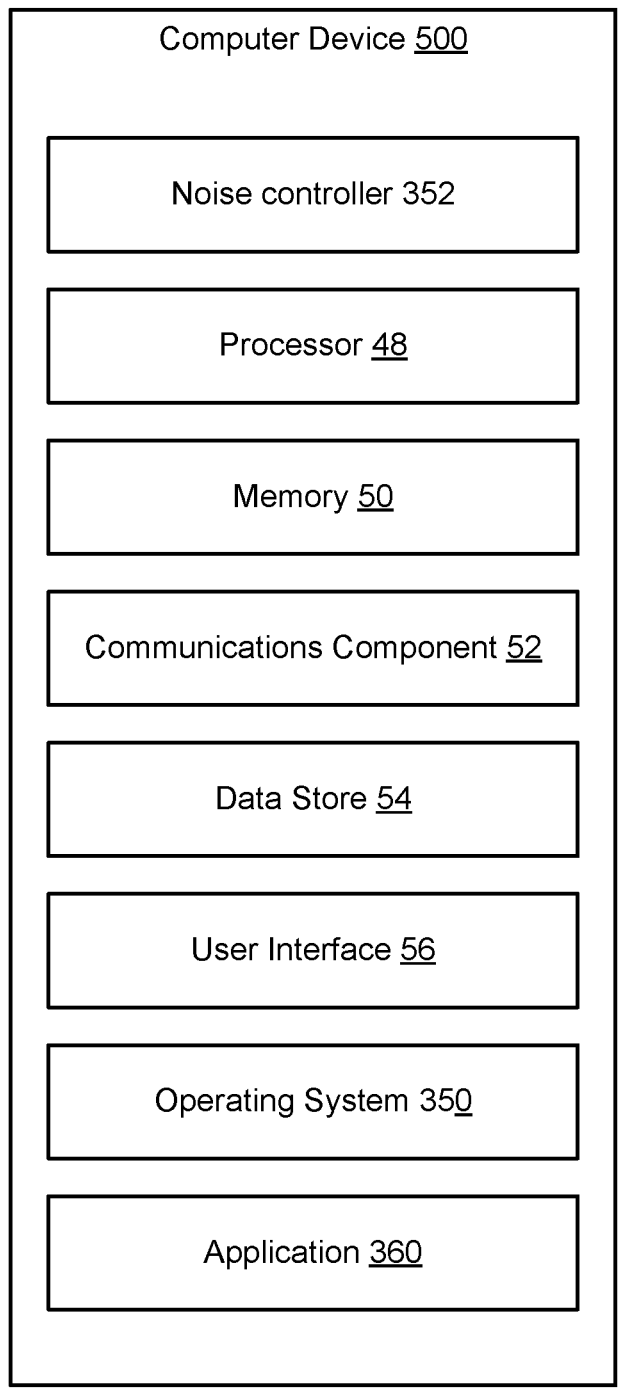
FIG. 5 is a block diagram of an example computer device in accordance with an implementation.

Referring now to FIG. 5, illustrated is an example computer device 500 in accordance with an implementation. The computer device 500 may include the noise controller 352 as well as additional component details as compared to FIGS. 1, 2, and 3. In one example, computer device 500 may include processor 48 for carrying out processing functions associated with one or more of components and functions described herein. Processor 48 can include a single or multiple set of processors or multi-core processors. Moreover, processor 48 can be implemented as an integrated processing system and/or a distributed processing system. In an implementation, for example, processor 48 may include CPU 120, GPU 122, CPU 220, GPU 222, or processor 340. In an example, computer device 500 may include memory 50 for storing instructions executable by the processor 48 for carrying out the functions described herein. In an implementation, for example, memory 50 may include memory 342.

Further, computer device 500 may include a communications component 52 that provides for establishing and maintaining communications with one or more parties utilizing hardware, software, and services as described herein. Communications component 52 may carry communications between components on computer device 500, as well as between computer device 500 and external devices, such as devices located across a communications network and/or devices serially or locally connected to computer device 500. For example, communications component 52 may include one or more buses, and may further include transmit chain components and receive chain components associated with a transmitter and receiver, respectively, operable for interfacing with external devices.

Additionally, computer device 500 may include a data store 54, which can be any suitable combination of hardware and/or software, that provides for mass storage of information, databases, and programs employed in connection with implementations described herein. For example, data store 54 may be a data repository for operating system 350 (FIG. 3) and/or applications 360 (FIG. 3).

Computer device 500 may also include a user interface component 56 operable to receive inputs from a user of computer device 500 and further operable to generate outputs for presentation to the user. User interface component 56 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, user interface component 56 may include one or more output devices, including but not limited to a display, a speaker, a haptic feedback mechanism, a printer, any other mechanism capable of presenting an output to a user, or any combination thereof.

In an implementation, user interface component 56 may transmit and/or receive messages corresponding to the operation of operating system 350 and/or application 360. In addition, processor 48 may execute operating system 350 and/or application 360, and memory 50 or data store 54 may store them.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computer devices 100, 200, and/or 300. By way of example, and not limitation, computer-readable media may include "computer-readable storage media" and "computer-readable signal media."

"Computer-readable storage media" may refer to media and/or devices that enable persistent storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computer device 100, 200, 300, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, processor 48 and memory 50 are representative of modules, programmable device logic and/or fixed device logic implemented in a hardware form that may be employed in some examples to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by memory 50. The computer device 500 may be configured to implement particular instructions and/or functions corresponding to the software and/or hardware modules. Accordingly, implementation of a module that is executable by the computer device 500 as software may be achieved at least partially in hardware, e.g., through use of computer-readable storage media and/or processor 48. The instructions and/or functions may be executable/operable by one or more articles of manufacture (for example, one or more computer devices 500) to implement techniques, modules, and examples described herein.

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A computer device, comprising:
one or more electronic components located in a passive cooling zone;
a wall dividing the passive cooling zone from an active cooling zone and acoustically isolating the active cooling zone from the passive cooling zone, wherein the wall substantially prevents airflow between the active cooling zone and the passive cooling zone;
a heat sink attached to at least one of the one or more electronic components, the heat sink extending from the passive cooling zone to the active cooling zone through the wall; and
at least one noise emitting component located in the active cooling zone, wherein the active cooling zone includes static noise filtering shapes configured to filter a known frequency of noise produced by the at least one noise emitting component.

2. The computer device of claim 1, wherein the noise filtering shapes comprise at least one of meshes, ports, or volumes.

3. The computer device of claim 2, wherein the noise filtering shapes form, a low pass filter.

4. The computer device of claim 1, wherein the at least one noise emitting component includes one or more of a fan, a capacitor, an inductor, a transformer, or a power supply.

5. The computer device of claim 1, wherein the heat sink comprises a plurality of parallel fins, wherein an air flow direction in the active cooling zone is parallel to the fins.

6. The computer device of claim 1, wherein the wall includes at least one of: sound dampeners or sound absorbing mesh.

7. The computer device of claim 1, wherein the one or more electronic components located in a passive cooling zone includes a processor configured to:
   determine a noise frequency of the at least one noise emitting component; and
   control a speaker to emit an anti-noise signal that cancels acoustic noise at the noise frequency.

8. The computer device of claim 7, wherein the processor is configured to filter the anti-noise signal with a digital notch filter corresponding to the noise frequency.

9. The computer device of claim 7, wherein the processor is configured to vary a speed of a fan located in the active cooling zone over time to maintain an average speed of the fan while avoiding a constant blade pass frequency for the fan.

10. A method of controlling noise in a computer device:
    determining, by a processor of the computer device, a noise frequency of a noise emitting component located within an active cooling zone of the computer device, the active cooling zone being acoustically isolated from a passive cooling zone of the computer device containing at least the processor, wherein determining the noise frequency comprises:
    setting an operational parameter of the noise emitting component;
    determining a calibrated noise frequency for the noise emitting component based on the operational parameter, wherein the noise frequency is a blade pass frequency of a fan, wherein the operational parameter is a current fan speed, and wherein determining the calibrated noise frequency comprises determining a blade pass frequency based on a number of blades of the fan and the current fan speed; and
    setting the noise frequency to the calibrated noise frequency; and
    controlling a speaker within the active cooling zone to emit an anti-noise signal cancelling the noise frequency.

11. The method of claim 10, wherein setting the current fan speed is based on a temperature of the processor.

12. The method of claim 10, further comprising filtering the anti-noise signal with a digital notch filter corresponding to the noise frequency.

13. The method of claim 10, further comprising varying a speed of a fan located in the active cooling zone over time to maintain an average speed of the fan while avoiding a constant blade pass frequency for the fan.

14. The method of claim 10, wherein the computer device includes:
    one or more electronic components located in the passive cooling zone;
    a heat sink attached to at least one of the one or more electronic components, the heat sink extending from the passive cooling zone to an active cooling zone;
    a noise emitting component located in the active zone; and
    a wall dividing the passive cooling zone from the active zone and acoustically isolating the active zone from the passive cooling zone.

15. A non-transitory computer-readable medium, comprising code executable by one or more processors for controlling noise in a computer device, the code comprising code for:
    determining, by a processor of the computer device, a noise frequency of a noise emitting component located within an active cooling zone of the computer device, the active cooling zone being acoustically isolated from a passive cooling zone of the computer device containing at least the processor, wherein the code for determining the noise frequency comprises code for:
    setting an operational parameter of the noise emitting component;
    determining a calibrated noise frequency for the noise emitting component based on the operational parameter, wherein the noise frequency is a blade pass frequency of a fan, wherein the operational parameter is a current fan speed, and wherein determining the calibrated noise frequency comprises determining a blade pass frequency based on a number of blades of the fan and the current fan speed; and
    setting the noise frequency to the calibrated noise frequency; and
    controlling a speaker within the active cooling zone to emit an anti-noise signal cancelling the noise frequency.

* * * * *